United States Patent
Suh et al.

(10) Patent No.: US 7,507,637 B2
(45) Date of Patent: Mar. 24, 2009

(54) METHOD OF MANUFACTURING WAFER LEVEL STACK PACKAGE

(75) Inventors: Min Suk Suh, Seoul (KR); Sung Min Kim, Seoul (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 11/647,914

(22) Filed: Dec. 29, 2006

(65) Prior Publication Data

US 2007/0218678 A1    Sep. 20, 2007

(30) Foreign Application Priority Data

Mar. 17, 2006    (KR) .................. 10-2006-0025047

(51) Int. Cl.
    *H01L 21/30* (2006.01)
(52) U.S. Cl. .............. 438/458; 438/667; 438/108; 438/455; 257/777; 257/E21.513; 257/E21.504
(58) Field of Classification Search ............. 438/109, 438/458, 459, 667, 455, FOR. 426; 257/E21.513, 257/E21.504
    See application file for complete search history.

(56) References Cited

U.S. PATENT DOCUMENTS

| 4,394,712 | A |  | 7/1983 | Anthony |
| 4,897,708 | A |  | 1/1990 | Clements |
| 5,489,554 | A |  | 2/1996 | Gates |
| 5,998,808 | A | * | 12/1999 | Matsushita .................. 257/74 |
| 6,448,661 | B1 |  | 9/2002 | Kim et al. |
| 6,642,081 | B1 | * | 11/2003 | Patti ........................... 438/109 |
| 7,074,703 | B2 | * | 7/2006 | Fukazawa ................... 438/598 |

FOREIGN PATENT DOCUMENTS

| JP | 2003-007972 | 1/2003 |
| JP | 2003-110054 | 4/2003 |

\* cited by examiner

*Primary Examiner*—George Fourson
*Assistant Examiner*—Julio J. Maldonado
(74) *Attorney, Agent, or Firm*—Ladas & Parry LLP

(57) ABSTRACT

To manufacture a wafer level stack package, first and second wafers having first and second via patterns are prepared. The second wafer is attached to the first wafer such that the front sides of the first and second wafers face each other and the first and second via patterns are connected to each other. The back side of the second wafer is ground and etched such that the lower ends of the second via patterns are exposed and projected. The back side of the first wafer is ground and etched such that the lower ends of the first via patterns are exposed and projected. A chip level stack structure is formed by sawing a wafer level stack structure having the stacked wafers into a chip level. The chip level stack structure is attached to a substrate having electrode terminals.

5 Claims, 9 Drawing Sheets

METHOD OF MANUFACTURING WAFER LEVEL STACK PACKAGE

CROSS-REFERENCE TO RELATED APPLICATIONS

The present application claims priority to Korean patent application number 10-2006-0025047 filed on Mar. 17, 2006, which is incorporated by reference in its entirety.

BACKGROUND OF THE INVENTION

The present invention relates to a semiconductor package, and more particularly, to a method of manufacturing a wafer level stack package in which semiconductor chips are stacked at a wafer level and connected to one another using via patterns.

Semiconductor devices were used for military purposes or computers in the earlier days. However, as society continues to evolve in response to the development of the Internet and other communication technologies, the application range of semiconductor devices has gradually increased. As a result, semiconductor devices are currently utilized in most electrical appliances, ranging from mobile products, including mobile phones and personal digital assistants ("PDA"), to traditional electrical home appliances, including televisions, audio systems, and even home boilers. In their application to various product groups, semiconductor devices must be capable of performing various functions. In particular, mobile products, such as mobile phones, increasingly demand high-speed, miniaturized semiconductors capable of multiple functionalities.

However, the complexity of circuits, ill-equipped manufacturing facilities, and increased processing costs have made it difficult to adapt the semiconductor manufacturing process to the demands of the afore-described technologies. As a result of these difficulties, the stack package has drawn considerable attention. In a stack package, uniform or different types of semiconductor chips are vertically stacked at the chip level or wafer level and electrically connected to one another through the via patterns formed on the respective chips, thereby producing one package.

Because the chips are vertically stacked in a stack package, unlike the existing single chip package, it is possible to manufacture a stack package with increased storage capacity by stacking uniform-type or size chips. It is also possible to manufacture a stack package capable of performing multiple functions by stacking different types of chips with information storage functions and logical operation functions. By vertically stacking chips in the aforementioned manner, it is therefore possible to create a miniaturized, multi-functional semiconductor product. Moreover, since the manufacture of stack packages merely requires existing semiconductor chips to be stacked in a combined manner and does not necessitate new equipment, the development time is shortened while the value of the end product is increased. Most importantly, the demands of various customers can be met simultaneously, and a new market can be developed by the application of the described technology to various product groups.

FIG. 1 is a cross-sectional view illustrating a conventional stack package. Referring to FIG. 1, uniform-size chips 110, 120, 130 and 140, are respectively formed with via patterns 112, 122, 132 and 142, are stacked on a substrate 100 through use of an adhesive 150. The upper surface of the substrate 100, including the chips 110, 120, 130 and 140, is molded by a molding material 160, and solder balls 170 are attached to the lower surface of the substrate 100.

The via patterns 112, 122, 132 and 142 used to electrically connect the stacked chips are formed as described below. FIGS. 2A through 2F are cross-sectional views illustrating the process steps for explaining a conventional method of forming via patterns. The respective drawings illustrate only via pattern forming regions.

Referring to FIG. 2A, a first photoresist pattern 202, which exposes the via pattern forming regions, is formed on the front side of a wafer 200 through a photolithography process.

Referring to FIG. 2B, the exposed regions of the wafer 200 are etched using the first photoresist pattern 202 as an etch barrier, thereby defining trenches T. At this time, the trenches T are defined to a depth so as to not pass through the wafer 200. Then, the first photoresist pattern 202 used as the etch barrier is removed.

Referring to FIG. 2C, an insulation layer 204 and a seed layer 206 are sequentially formed on the front side of the wafer 200 including the surfaces of the trenches T. A second photo resist pattern 208, which exposes the via pattern forming regions, is formed on the seed layer 206. A metal layer, such as a Cu layer, is formed on the exposed portions of the seed layer 206 using an appropriate method, such as electro plating, thereby forming via patterns 212 that fill the trenches T. While it is described that the via patterns 212 are formed through an electro plating method, they can also be formed using other methods, such as a damascene process.

Referring to FIG. 2D, the second photoresist pattern 208 is removed. The portions of the seed layer 206 exposed by the removal of the second photoresist pattern 208 are subsequently removed in the same manner.

Referring to FIG. 2E, in order to improve workability in a subsequent back grinding process, that is, in order to prevent the wafer 200 from being damaged during a back grinding process, a protective layer 214 made of glass is formed on the front side of the wafer 200 which is formed with the via patterns 212.

Referring to FIG. 2F, the back side of the wafer 200 is ground such that the lower ends of the via patterns 212 are exposed, and the back side of the ground wafer 200 is wet or dry etched to expose a portion of the lower ends of the via patterns 212. Then, the protective layer 214 is removed. Thereupon, the wafer level chips are divided into a chip level through a sawing process.

In a stack package in which semiconductor chips are connected through the via patterns formed as described above, the difficulties of securing space for the formation of bonding wires is eliminated, thereby allowing the size of the package to be decreased and the mounting density to be increased. Also, in a stack package in which semiconductor chips are connected through the via patterns, use of the via patterns as the shortest interconnection routes allows for excellent electrical characteristics.

However, in the above-described conventional stack package, since stacking is implemented at the chip level, as compared to a type in which stacking is implemented at the wafer level, the need to repeatedly conduct the process for each package increases the processing time and manufacturing costs.

Meanwhile, in a stack package using via patterns, if the wafer level structure is sawed into chip level structures after stacking is implemented at the wafer level, the number of processes, the processing time and the manufacturing costs can be decreased. Nevertheless, when stacking is implemented at the wafer level according to the conventional art, a serious problem is caused in that handling of a thin and wide wafer is likely to cause stresses and cracks in the wafer, and the wafer is likely to be broken. Hence, in the conventional art, difficulties exist in implementing the stacking at the wafer level.

SUMMARY OF THE INVENTION

The embodiment of the present invention is directed to a method of manufacturing a wafer level stack package in which semiconductor chips are stacked at the wafer level, thereby simplifying the process, decreasing the processing time, and reducing the manufacturing costs.

In the embodiment, a method of manufacturing a wafer level stack package, comprising the steps of i) preparing a first wafer which has the first via patterns projecting from the front side thereof and a second wafer which has the second via patterns projecting from the front side thereof; ii) attaching the second wafer to the first wafer such that the front sides of the first and second wafers face each other and the first and second via patterns are connected to each other; iii) grinding a back side of the second wafer such that the lower ends of the second via patterns are exposed; iv) projecting the lower ends of the second via patterns by etching the back side of the ground second wafer; v) grinding a back side of the first wafer such that the lower ends of the first via patterns are exposed; vi) projecting the lower ends of the first via patterns by etching the back side of the ground first wafer; vii) forming a chip level stack structure by sawing a wafer level stack structure having the stacked wafers into a chip level stack structure; viii) attaching the chip level stack structure to a substrate having electrode terminals such that the first via patterns are connected to the electrode terminals; ix) molding the upper surface of the substrate including the chip level stack structure using a molding material; and x) attaching solder balls to the lower surface of the substrate.

After step iv) and before step v), the method may further comprise the step of preparing at least one wafer having the same configuration as the first and second wafers and repeatedly implementing steps ii) through iv).

The first and second wafers are attached to each other using an adhesive such as an anisotropic conductive film ("ACF").

DESCRIPTION OF SPECIFIC EMBODIMENT

In the present invention, first and second wafers, which respectively have first and second via patterns and are not back-ground, are prepared. The second wafer is stacked on the first wafer in a manner such that the front sides of the first and second wafers face each other and the first and second via patterns are connected to each other. The back side of the second wafer is then ground and etched in order to project the lower ends of the second via patterns. Similarly, the back side of the first wafer is ground and etched to project the lower ends of the first via patterns. Here, in the present invention, before the back side of the first wafer is ground and etched, a desired number of wafers having the same configuration as the first and second wafers can be prepared and stacked on the second wafer in the same manner as described above. Thereupon, by sawing the wafer level structure, chip level structures are obtained, and by packaging the chip level structures, stack packages are created.

Consequently, in the present invention, wafers having via patterns are stacked in a state in which they are not back-ground, and, after stacking, necessary wafers are back-ground and etched, thereby eliminating the likelihood of breaking the wafers during handling. Thus, in the present invention, because the stacking process can be conducted at the wafer level, the process can be simplified, the processing time can be decreased, and the manufacturing costs can be reduced.

FIGS. 3A through 3I are cross-sectional views illustrating the process steps for explaining a method of manufacturing a wafer level stack package in accordance with an embodiment of the present invention. The method will be described in detail with reference to FIGS. 3A through 3I.

Figure 1:
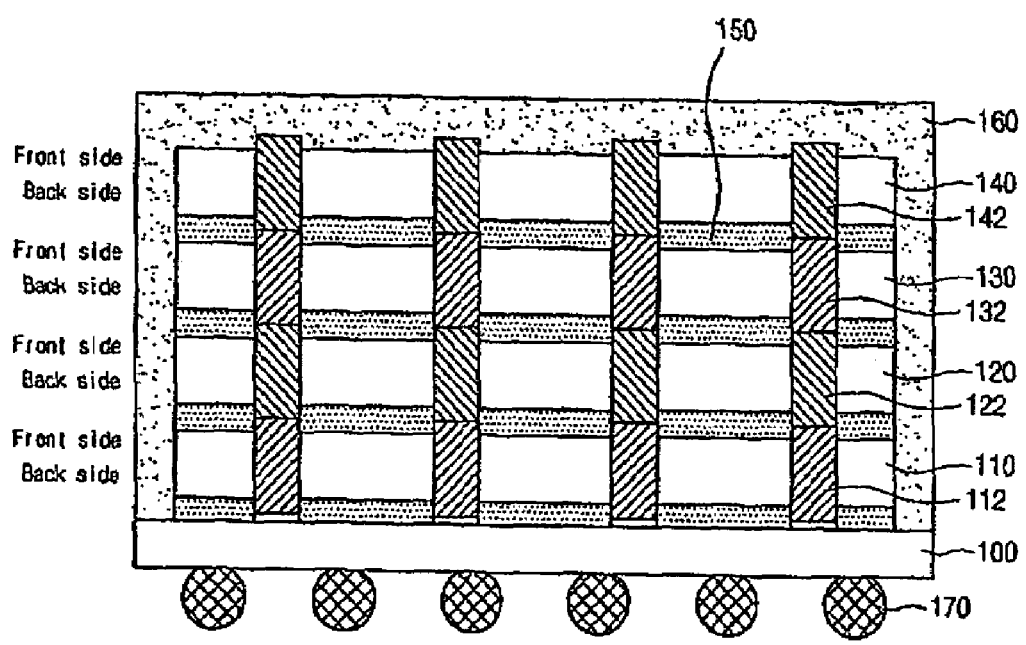
FIG. 1 is a cross-sectional view illustrating a conventional stack package.
Figure 2A:
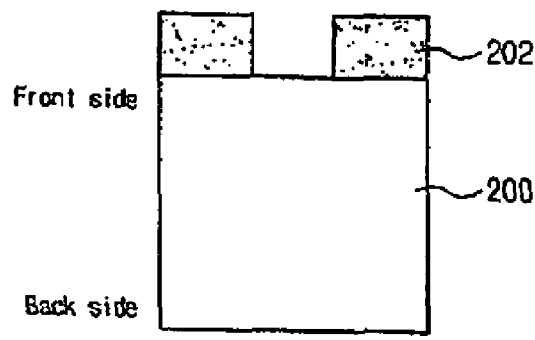
FIGS. 2A through 2F are cross-sectional views illustrating the process steps for explaining a conventional method of forming via patterns.
Figure 2B:
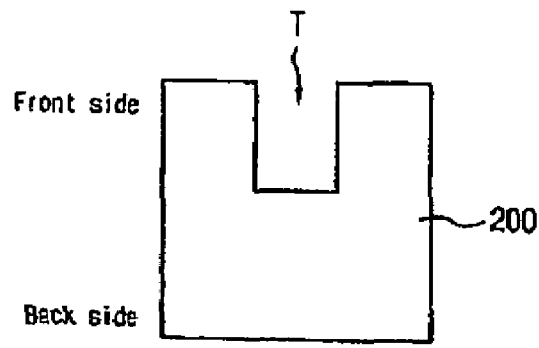
Figure 2C:
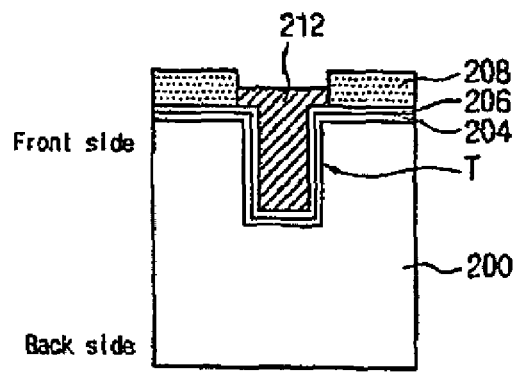
Figure 2D:
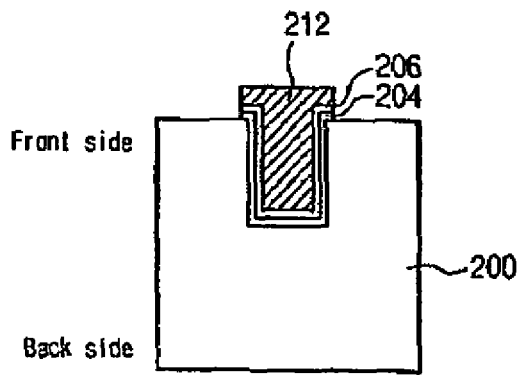
Figure 2E:
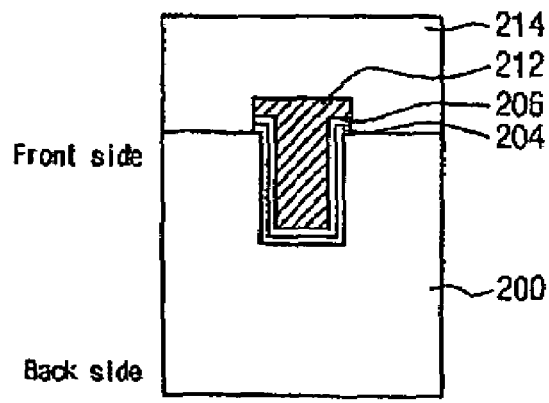
Figure 2F:
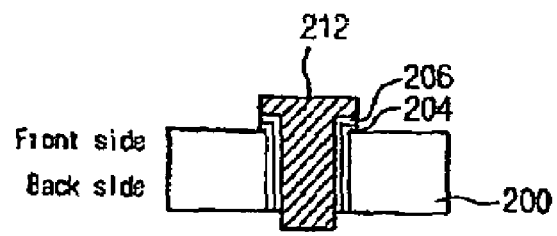
Figure 3A:
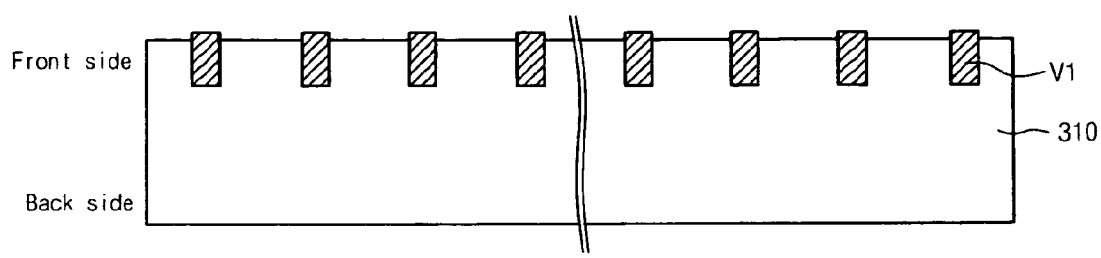
FIGS. 3A through 3I are cross-sectional views illustrating the process steps for explaining a Method of manufacturing a wafer level stack package in accordance with an embodiment of the present invention.

Referring to FIG. 3A, a first wafer 310, which has completely undergone a semiconductor manufacturing process, is prepared. First via patterns V1 with projecting upper ends are formed on the front side of the first wafer 310 according to the method as illustrated with respect to FIGS. 2A through 2D. While not shown in the drawing, the first via patterns V1 include insulation layers and seed layers. Here, the back side of the first wafer 310 is not ground.

Figure 3B:
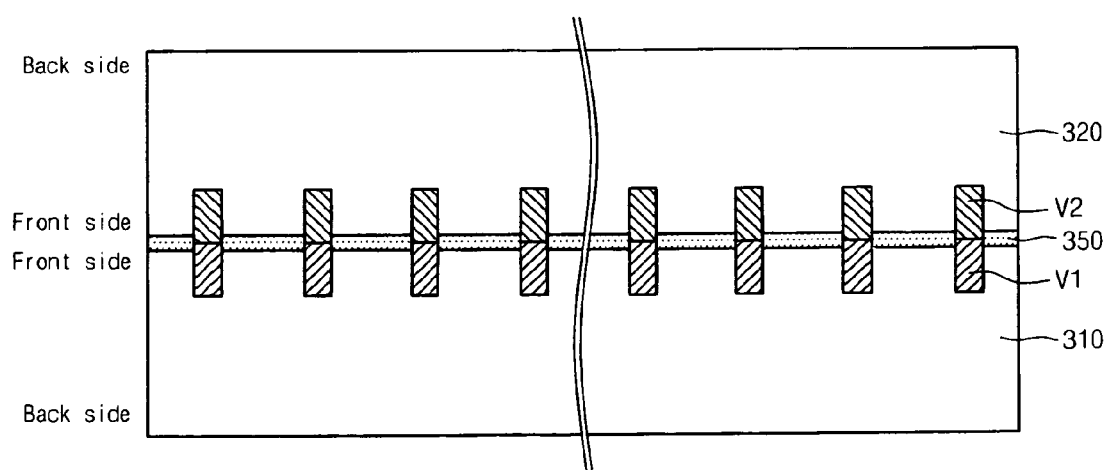

Referring to FIG. 3B, a second wafer 320 is prepared. Similarly to the first wafer 310, the second wafer 320 is formed with the upper ends of the second via patterns V2 projecting from the front side of the second wafer 320. The second wafer 320 is attached to the first wafer 310 in a face-down manner such that the front side of the second wafer 320 faces the front side of the first wafer 310, and the projecting upper ends of the first via patterns V1 are connected to the projecting upper ends of the second via patterns V2. At this time, the attachment of the second wafer 320 to the first wafer 310 is implemented through applying an adhesive 350 between the two wafers, such as an anisotropic conductive film (ACF).

Figure 3C:
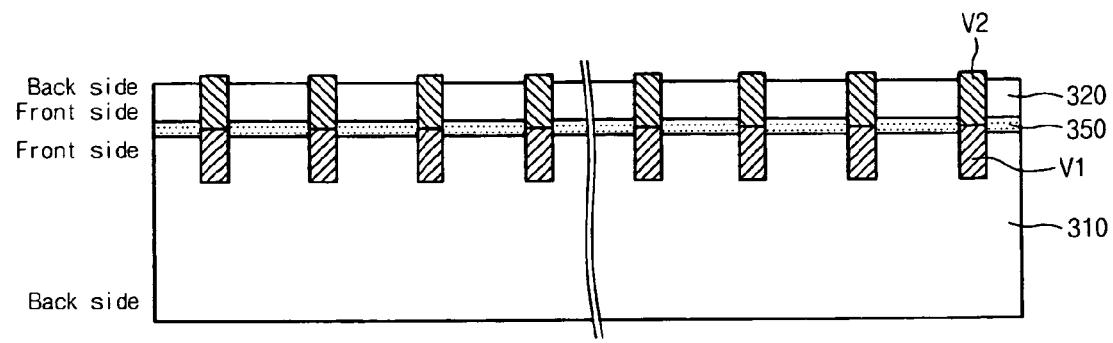

Referring to FIG. 3C, the back side of the second wafer 320 is ground such that the second via patterns V2 are exposed. Then, the back side of the ground second wafer 320 is etched in order to partially project a portion of the lower ends of the second via patterns V2.

Figure 3D:
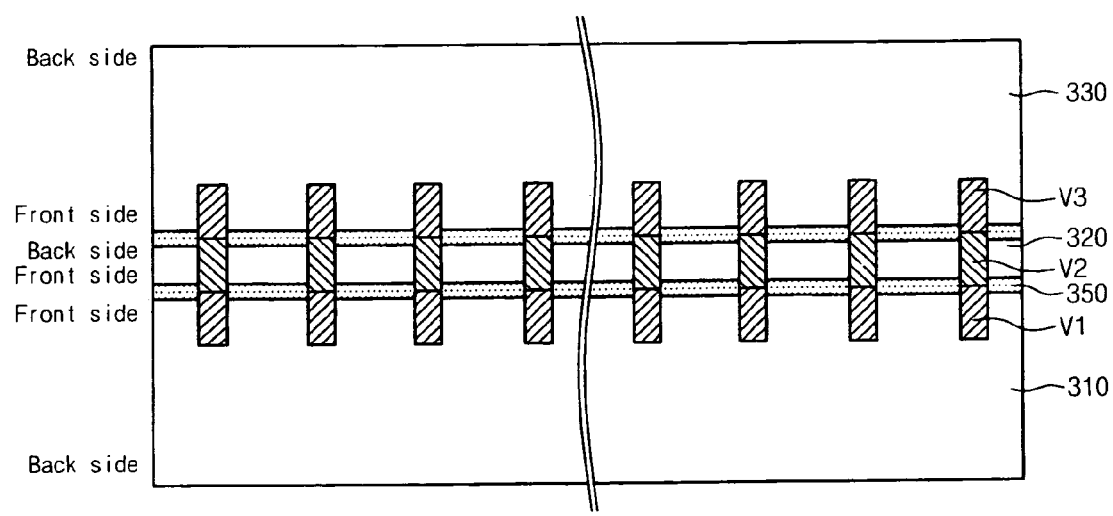

Referring to FIG. 3D, a third wafer 330 is prepared. Similarly to the first and second wafers 310 and 320, the third wafer 330 is formed with the upper ends of the third via patterns V3 projecting from the front side of the third wafer 330. In the same manner as the second wafer 320 is stacked on the first wafer 310, the third wafer 330 is attached to the back side of the second wafer 320 in a face-down manner using an adhesive 350 such that the front side of the third wafer 330 faces the back side of the second wafer 320 and the second via patterns V2 are connected to the third via patterns V3.

Figure 3E:
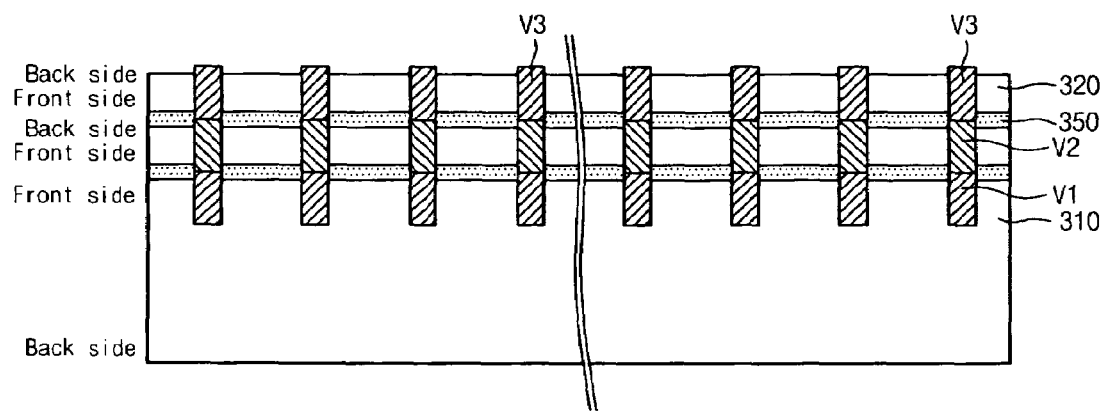

Referring to FIG. 3E, the back side of the third wafer 330 is ground such that the third via patterns V3 are exposed. The back side of the ground third wafer 330 is then etched in order to project a portion of the lower ends of the third via patterns V3.

Figure 3F:
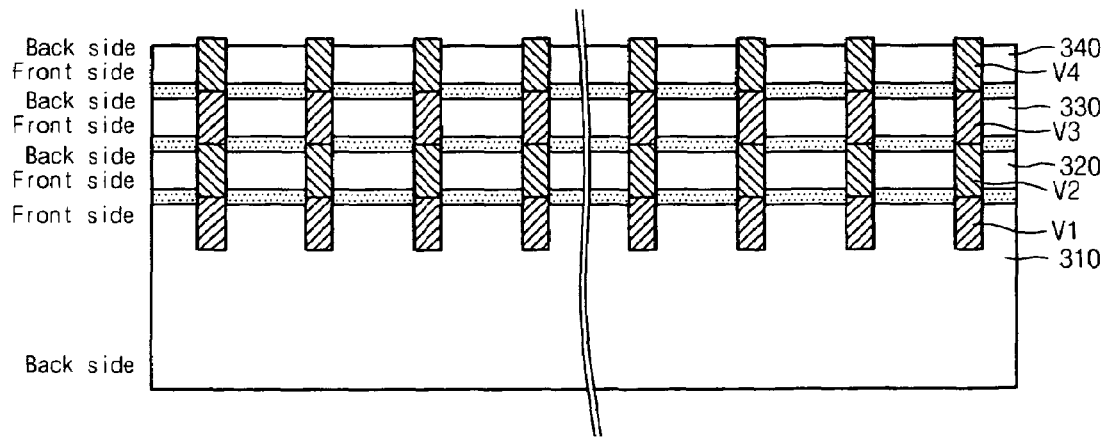

Referring to FIG. 3F, a fourth wafer 340 is prepared. The fourth wafer 340 is formed with the upper ends of the fourth via patterns V4 projecting from the front side of the fourth wafer 340. In the same manner as described above, the fourth wafer 340 is attached to the back side of the third wafer 330 in a face-down manner using an adhesive 350 such that the front side of the fourth wafer 340 faces the back side of the third wafer 330 and the third via patterns V3 are connected to the fourth via patterns V4. The back side of the fourth wafer 340 is ground and then etched such that the lower ends of the fourth via patterns V4 are projected.

Figure 3G:
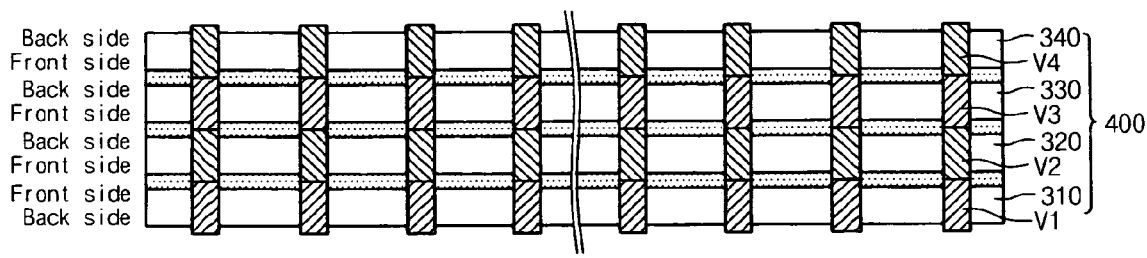

Referring to FIG. 3G, the back side of the first wafer 310 is ground such that the lower ends of the first via patterns V1 are exposed. Then, the back side of the first wafer 310, excluding the exposed first via patterns V1, is etched to project a portion of the lower ends of the first via patterns V1. Consequently, a wafer level stack structure 400 is obtained in which the via patterns V1, V2, V3 and V4 are connected to one another and the first via patterns V1 are projected from the lower end of the wafer level stack structure 400.

Here, while not shown in the drawings, grinding and etching of the back side of the first wafer 310 is implemented while a protective layer is formed on the back side of the fourth wafer 340 including the fourth via patterns V4 in order to prevent the wafer level stack structure 400 from being damaged. Thereafter, the protective layer is removed.

Meanwhile, while four wafers are stacked upon one another in the present embodiment, it is to be readily understood that, before grinding the back side of the first wafer 310, a desired number of wafers can be sequentially stacked on the back side of the fourth wafer 340 in the same manner as described above.

Figure 3H:
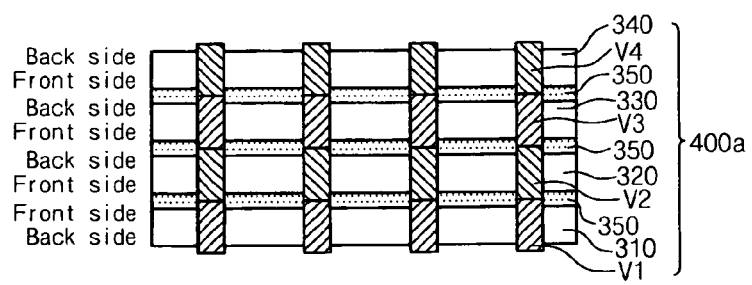
Figure 3H:
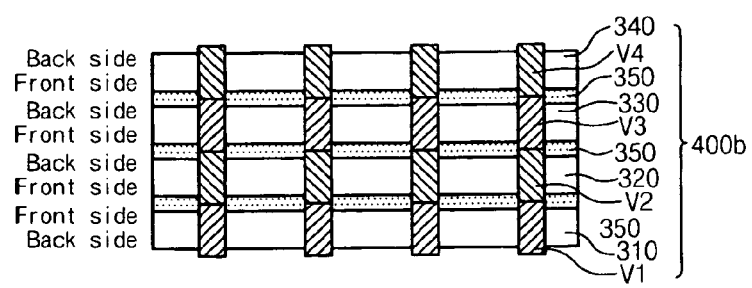

Referring to FIG. 3H, the wafer level stack structure 400, which has the first via patterns V1 projecting from the lower end thereof, is sawed into a chip level, and as a result, a plurality of chip level stack structures 400a and 400b are created.

Figure 3I:
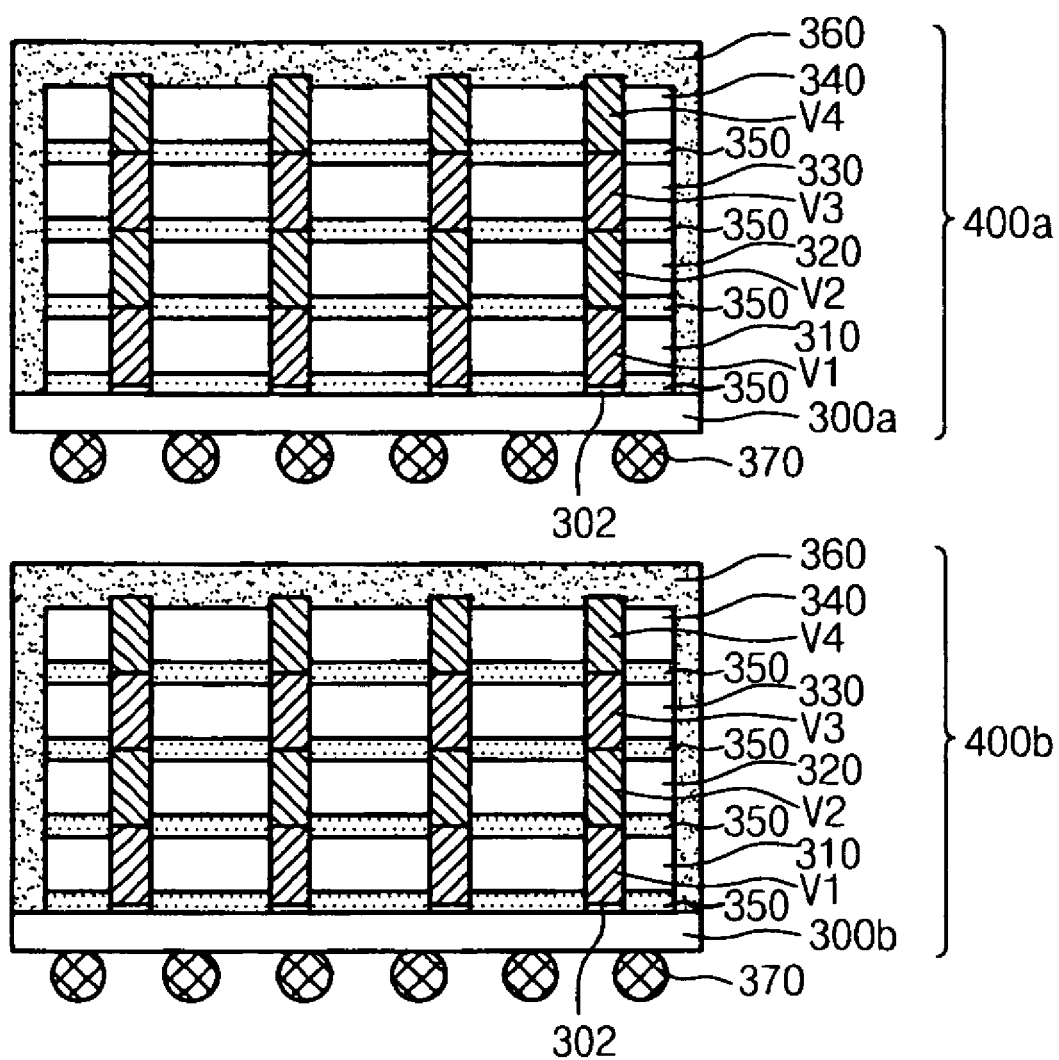

Referring to FIG. 3I, the chip level stack structures 400a and 400b are respectively attached to substrates 300a and 300b having electrode terminals 302 using an adhesive 350 such that the lower ends of the first via patterns V1 and the electrode terminals 302 are connected to each other. Then, the upper surfaces of the substrates 300a and 300b including the chip level stack structures 400a and 400b are molded using a molding material 360. Solder balls 370 are attached to the lower surfaces of the substrates 300a and 300b as mounting means to external circuits, thereby completing the manufacture of the wafer level stack package according to the present invention.

As is apparent from the above description, in the present invention, wafers, which have respective via patterns and are not back-ground, are stacked such that the front sides of the wafers face each other and the respective via patterns are connected to each other. Then, a plurality of wafers are stacked in a manner such that the back side of an upwardly located wafer is ground and etched in order to project the via patterns thereof. When a desired number of wafers are stacked, the back side of the wafer located lowermost is ground and etched in order to project the via patterns thereof, and thereby, a wafer level stack structure is created. By sawing the wafer level stack structure, a plurality of chip level stack structures are obtained. Thereafter, by conducting a packaging process, a plurality of chip level stack packages are manufactured.

In the present invention, since the wafers are stacked in a state in which they are not back-ground, it is possible to prevent a wafer from being broken while the wafer is handled. Therefore, since a stack package can be manufactured at the wafer level without concern regarding breakage of a wafer, the process can be simplified, the processing time can be decreased, and the manufacturing cost can be reduced compared to the conventional art in which stack packages are manufactured at a chip level.

Although a specific embodiment of the present invention has been described for illustrative purposes, those skilled in the art will appreciate that various modifications, additions and substitutions are possible, without departing from the scope and the spirit of the invention as disclosed in the accompanying claims.

What is claimed is:

1. A method of manufacturing a wafer level stack package, comprising the steps of:
    preparing a first wafer with first via patterns projecting from a front side thereof and a second wafer with second via patterns projecting from a front side thereof;
    attaching the second wafer to the first wafer such that the front sides of the first and second wafers face each other and the first and second via patterns are connected to each other;
    grinding a back side of the second wafer such that lower ends of the second via patterns are exposed;
    projecting the lower ends of the second via patterns by etching the back side of the ground second wafer;
    adding a protective layer to the backside of the second wafer if the second wafer is a last layer added;
    grinding a back side of the first wafer such that lower ends of the first via patterns are exposed;
    projecting the lower ends of the first via patterns by etching the back side of the ground first wafer to form a wafer level stack structure;
    removing the protective layer from the last layer after grinding the backside of the first wafer and after protecting the lower ends of the first via patterns from the back side of the ground first wafer;
    forming a chip level stack structure by sawing the wafer level stack structure when the lower ends of the first via patterns project from the back side of the first wafer of the wafer level stack structure and when the lower ends of the second via patterns project from the back side of the second wafer of the wafer level stack structure;
    attaching the chip level stack structure to a substrate with electrode terminals such that the first via patterns are connected to the electrode terminals;
    molding an upper surface of the substrate including the chip level stack structure using a molding material; and
    attaching solder balls to the lower surface of the substrate.

2. The method of claim 1, wherein, after the step of projecting the lower ends of the second via patterns by etching the back side of the ground second wafer and before the step of grinding the back side of the first wafer such that lower ends of the first via patterns are exposed, the method further comprises the step of:
    preparing a third wafer having third via patterns with the same configuration as the first and second wafers;
    attaching the third wafer to the second wafer such that the front side of the third wafer and the back side of the second wafer face each other and the third and second via paterns are connected to each other;
    grinding the back side of the third wafer such that lower ends of the third via patterns are exposed;
    projecting the lower ends of the third via patterns by etching the back side of the ground third wafer; and
    adding a protective layer to the backside of the third wafer if the third wafer is the last layer added.

3. The method of claim 1, wherein the first and second wafers are attached to each other using an adhesive.

4. The method of claim 3, wherein the adhesive comprises an anisotropic conductive film.

5. The method of claim 2, wherein after the step of projecting the lower ends of the third via patterns by etching the back side of the ground third wafer and before the step of grinding the back side of the first wafer such that lower ends of the first via patterns are exposed, the method further comprises the step of:

preparing a fourth wafer having fourth via patterns with the same configuration as the first, second and third wafers;

attaching the fourth wafer to the third wafer such that the front side of the fourth wafer and the back side of the third wafer face each other and the third and fourth via paterns are connected to each other;

grinding the back side of the third water such that lower ends of the third via patterns are exposed;

projecting the lower ends of the fourth via patterns by etching the back side of the ground fourth wafer; and adding a protective layer to the backside of the fourth wafer if the fourth wafer is the last layer added.

* * * * *